United States Patent
McKittrick et al.

(10) Patent No.: US 12,439,518 B2
(45) Date of Patent: Oct. 7, 2025

(54) INFORMATION HANDLING SYSTEM DUAL LAYER MODULAR PRINTED CIRCUIT BOARD INTERPOSER

(71) Applicant: Dell Products L.P., Round Rock, TX (US)

(72) Inventors: Allen B. McKittrick, Cedar Park, TX (US); Jeffrey D. Kane, Austin, TX (US); Paul Lalinde, Spring, TX (US); Jonathan Isom, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 161 days.

(21) Appl. No.: 18/542,992

(22) Filed: Dec. 18, 2023

(65) Prior Publication Data

US 2025/0203777 A1 Jun. 19, 2025

(51) Int. Cl.
*H05K 1/14* (2006.01)
*H05K 1/11* (2006.01)
*H05K 1/18* (2006.01)

(52) U.S. Cl.
CPC ............. *H05K 1/142* (2013.01); *H05K 1/111* (2013.01); *H05K 1/181* (2013.01); *H05K 2201/10378* (2013.01); *H05K 2201/10409* (2013.01); *H05K 2201/10984* (2013.01)

(58) Field of Classification Search
CPC ........ H05K 1/111; H05K 1/142; H05K 1/181; H05K 2201/10378; H05K 2201/10409; H05K 2201/10984
See application file for complete search history.

(56) References Cited

U.S. PATENT DOCUMENTS

| | | | |
|---|---|---|---|
| 7,495,330 B2 | 2/2009 | Ichikawa | |
| 8,481,861 B2 | 7/2013 | Cooney et al. | |
| 8,958,214 B2 | 2/2015 | Colbert et al. | |
| 10,003,145 B1 | 6/2018 | Annis et al. | |
| 10,218,098 B1* | 2/2019 | Lian | H01R 12/716 |
| 10,354,356 B2 | 7/2019 | Hu et al. | |
| 10,660,206 B2 | 5/2020 | Mundt et al. | |
| 11,006,524 B2 | 5/2021 | Myers et al. | |
| 2013/0148322 A1* | 6/2013 | Fosnes | H05K 1/144 29/842 |
| 2017/0142824 A1* | 5/2017 | Puzella | H05K 1/0237 |
| 2019/0317566 A1* | 10/2019 | Schnell | G06F 1/185 |
| 2021/0212210 A1 | 7/2021 | Trelford et al. | |

OTHER PUBLICATIONS

Amphenol Communications Solutions, "Cool Stack 0.80mm Hybrid Power & Signal Connectors," downloaded from https://www.amphenol-cs.com/product-series/cool-stack-0-80mm-hybrid-power-signal.html on Dec. 14, 2023, 2 pages.

* cited by examiner

Primary Examiner — Robin J Mishler
(74) Attorney, Agent, or Firm — Zagorin Cave LLP; Robert W. Holland

(57) ABSTRACT

An information handling system main printed circuit board having a CPU couples to a graphics printed circuit board having a GPU with an interposer that includes contacts and wirelines that communicate signals between the separate boards. For example, an interposer couples to an upper and lower side of the main and graphics printed circuit boards to align spring contacts with contact pads of the main and graphics printed circuit so that signals are transferred through the interposer, which also provides a physical structure to define a motherboard with the assembly of the main and graphics printed circuit boards into a single piece.

20 Claims, 16 Drawing Sheets

INFORMATION HANDLING SYSTEM DUAL LAYER MODULAR PRINTED CIRCUIT BOARD INTERPOSER

BACKGROUND OF THE INVENTION

Field of the Invention

The present invention relates in general to the field of information handling systems, and more particularly to an information handling system dual layer modular printed circuit board interposer.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems couple processing components onto circuit boards assembled in housings so that the processing components cooperate to process information. Stationary information handling systems, such as towers and desktops, generally have a fixed housing location that uses external power and peripheral devices. Portable information handling systems integrate processing components, a display and a power source in a portable housing to support mobile operations. Portable information handling systems allow end users to carry a system between meetings, during travel, and between home and office locations so that an end user has access to processing capabilities while mobile. Tablet configurations typically expose a touchscreen display on a planar housing that both outputs information as visual images and accepts inputs as touches. Convertible configurations typically include multiple separate housing portions that couple to each other so that the system converts between closed and open positions. For example, a main housing portion integrates processing components and a keyboard and rotationally couples with hinges to a lid housing portion that integrates a display. In clamshell configuration, the lid housing portion rotates approximately ninety degrees to a raised position above the main housing portion so that an end user can type inputs while viewing the display. After usage, convertible information handling systems rotate the lid housing portion over the main housing portion to protect the keyboard and display, thus reducing the system footprint for improved storage and mobility. Generally, portable information handling systems will also interact with peripheral devices in a manner similar to stationary systems.

A typical information handling system has a central processing unit (CPU) that executes instructions to process information, such as an operating system and applications that accept end user inputs and output information for presentation to an end user as visual images at a display. As such, the typical information handling system has a main printed circuit board (PCB) typically known as a motherboard that supports the CPU and a graphics processing unit (GPU) that provides additional processing capability to generate visual images. Each of these processors typically include an assortment of power components to ensure that a rapid response of power is available when processing demands spike. In addition, each of these processors have thermal rejection constraints to prevent overheating. In some instances, the GPU will install on the motherboard; however, some configurations with larger housing areas will sometimes use a separate daughter board for the GPU to help manage thermal constraints. In such configurations, the daughter board will typically communicate through a cable with the motherboard.

Often, end users select information handling systems based upon both the CPU and GPU capabilities. For example, a typical platform will have multiple CPU types that can populate a CPU socket and multiple GPU types that can populate the GPU socket. The various iterations of CPU and GPU types can result in multiple different platform configurations. Although this offers greater end user control over system price and capability, the multiple configurations tend to increase the complexity of the manufacture process. For example, each CPU and GPU can have different power and related components so that each motherboard that has both the CPU and GPU will have its own configuration specific to the CPU/GPU combination. This complicates the manufacture and inventory environment, particularly in portable information handling systems that have minimal space within the housing and that generally have to include both the GPU and CPU on the motherboard.

SUMMARY OF THE INVENTION

Therefore, a need has arisen for a system and method which assembles separate CPU and GPU boards into one motherboard.

In accordance with the present invention, a system and method are provided which substantially reduce the disadvantages and problems associated with previous methods and systems to manufacture information handling system motherboards that have both a CPU and GPU. A main board having a CPU is selected for main board characteristics and assembled by an interposer with a graphics board selected for graphics characteristics. The interposer interfaces the main and graphics boards to communicate power, ground and information while also providing physical structure to couple the main and graphics boards into a motherboard component.

More specifically, an information handling system processes information with a central processing unit (CPU) and memory coupled to a main printed circuit board that cooperate to execute instructions. The information is presented as visual images at display by a graphics processing unit (GPU) coupled to a graphics printed circuit board. The main and graphics printed circuit boards communicatively couple to each other through an interposer that also provides structural support to hold the main and graphics boards together as a motherboard that is assembled into an information handling system housing. In one embodiment, the interposer has upper and lower portions to interface with top and bottom surfaces of the main and graphics boards, thereby doubling the footprint for including contact pads and enhancing motherboard structural strength.

The present invention provides a number of important technical advantages. One example of an important technical advantage is that an information handling system motherboard is assembled by an interposer from separate main and graphics circuit boards so that an information handling system is readily tailored to desired characteristics by selection of main and graphics boards while assembling into different types of platforms. The interposer provides substantial structural strength to hold the circuit board contacts in communication with each other. Alignment pins and screw inserts offer precise alignment of the contacts for assembly, which can include automated pick and place assembly of most if not all components needed to support the interposer coupling process.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

An information handling system motherboard assembles from a main board and graphics board interface by an interposer that couples directly to both the main board and graphics board to communicate between contact pads with wirelines of the interposer. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
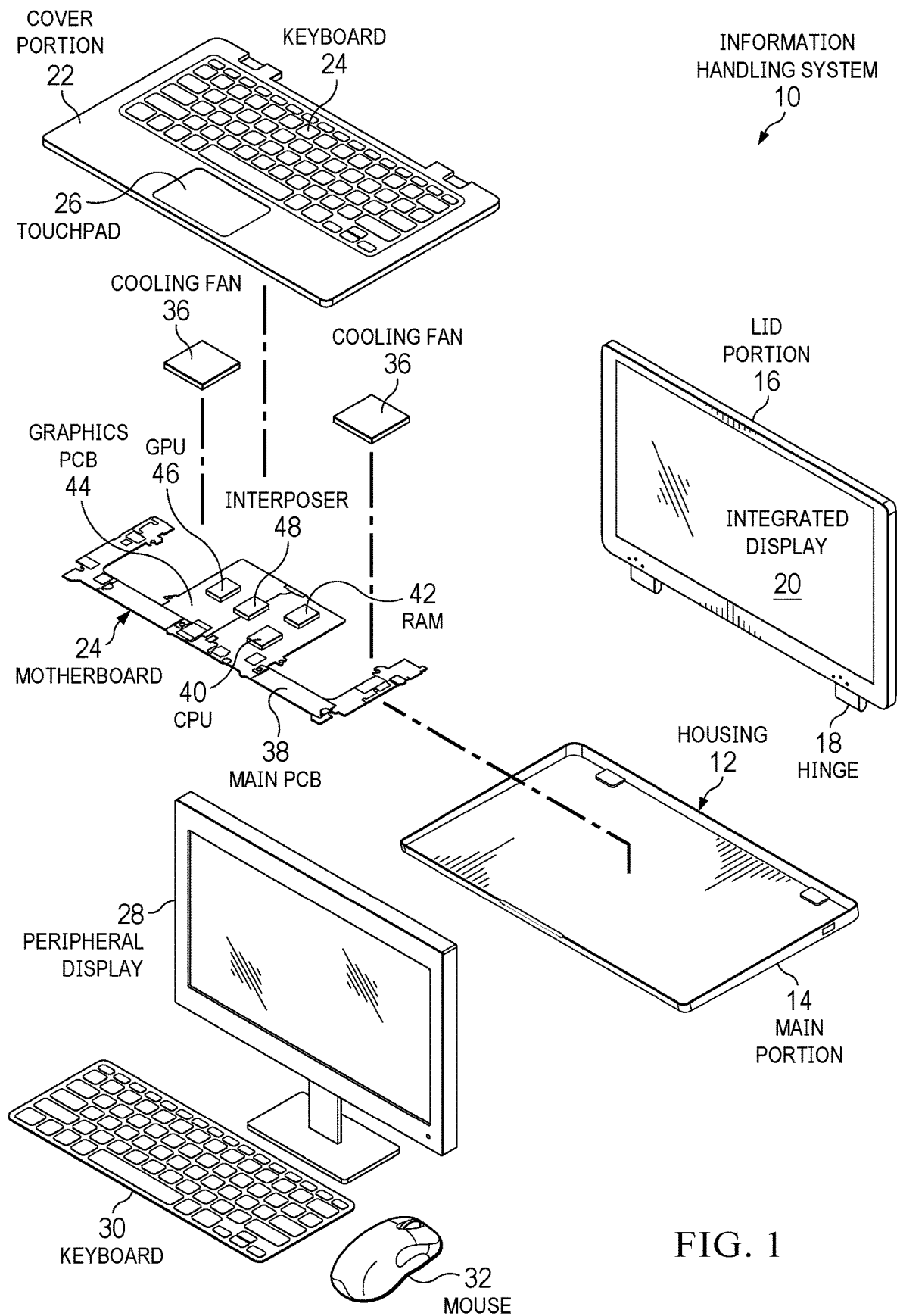
FIG. 1 depicts an exploded perspective view of an information handling system having a motherboard assembled from a main printed circuit board and graphics printed circuit board by an interposer.

Referring now to FIG. 1, an exploded perspective view depicts an information handling system 10 having a motherboard 34 assembled from a main printed circuit board 38 and graphics printed circuit board 44 by an interposer 48. In the example embodiment, information handling system 10 is built in a portable housing 12 having a main portion 14 rotationally coupled to a lid portion 16 by a hinge 18. In alternative embodiments, information handling system 10 may be built from stationary housings, such as desktop or tower housings. Housing lid portion 16 holds an integrated display 20 that presents the information as visual images. A housing cover portion 22 couples over housing main portion 14 to cover the processing components and to support a keyboard 24 and touchpad 26 that accept end user inputs. In addition to interacting with the integrated display, keyboard and touchpad, information handling system 10 may interact with external peripheral devices, such as a peripheral display 28, peripheral keyboard 30 and peripheral mouse 32. For example, an operating system executing on main printed circuit board 38 manages inputs by the integrated and peripheral keyboards, generation of visual images at graphics printed circuit board 44 and presentation of the visual images at the peripheral and integrated displays.

Motherboard 34 couples in housing main portion 14 with a set of two cooling fans 36 configured to provide cooling airflow at main printed circuit board 38 and graphics printed circuit board 44. Main printed circuit board 38 couples a central processing unit (CPU) 40 that executes instructions to process information and a random access memory (RAM) 42 that stores the instructions and information. Graphics printed circuit board 44 couples a graphics processing unit (GPU) 46 that interfaces with CPU 40 to perform additional processing on the information that defines visual images. For example, GPU 46 generates pixel values that define colors for presentation at pixels of the displays having a cumulative effect of creating a visual image. CPU 40 generates visual information that defines what will be presented while GPU 46 performs specialized and repetitive operations on the visual information to create the pixel values. Both CPU 40 and GPU 46 operate with power demands and thermal generation that can vary dramatically as processing demands fluctuate. Interposer 48 couples to main printed circuit board 38 and graphics printed circuit board 44 to communicate information, power and ground between the two separate boards, effectively combining the two separate boards into one motherboard. The structure of interposer 48 adjusts to adapt to the types of interfaces that different kinds of CPUs and GPUs need based upon their information processing capabilities.

Figure 2:
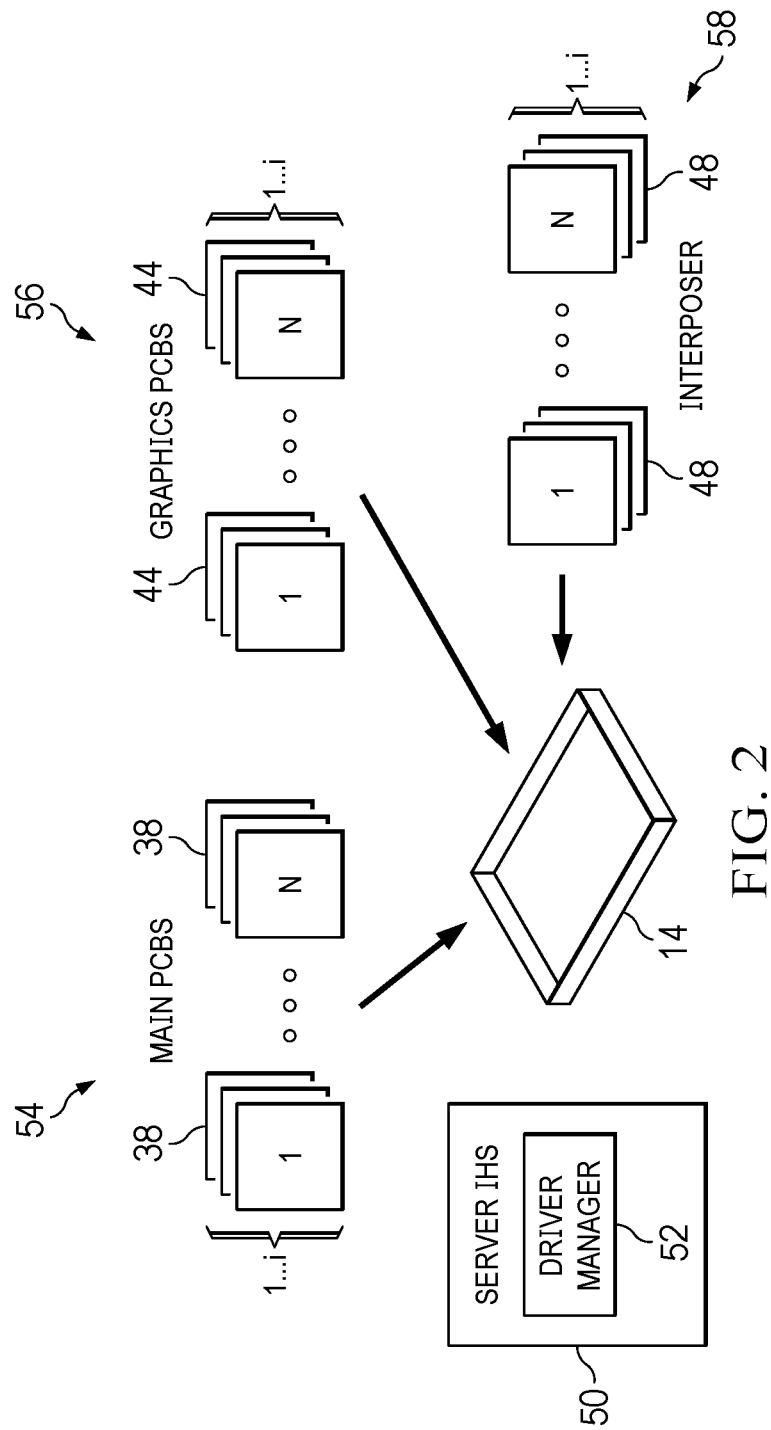
FIG. 2 depicts a system for managing assembly of a motherboard from a graphics board and main board to achieve selectable system processing and graphics capabilities.

Referring now to FIG. 2, a system is depicted for managing assembly of a motherboard from a graphics board and main board to achieve selectable system processing and graphics capabilities. A server information handling system 50 executes an driver manager 52 that tracks configurations of processing and graphics capabilities ordered by end users to coordinate assembly of motherboards for use in information handling systems. A main board inventory 54 includes plural sets 1 to n of plural main printed circuit boards 1 to I where each set of main printed circuit boards has a common CPU and supporting infrastructure, such as power and memory. A graphics board inventory 56 includes plural sets 1 to n of plural graphics printed circuit boards 1 to I where each set of graphics printed circuit boards has a common GPU and supporting infrastructure, such as power and memory. An inventory 58 of interposers 48 are selected to interface the main and graphics printed circuit boards for assembly into housing main portion 14. The breakdown of main and graphics capabilities into separate printed circuit boards provides enhanced opportunities for efficient manufacture of information handling systems as end user demands shift between different levels of processing and graphics capabilities. In one embodiment, different types of interposers 48 may be used to further enhance interchangeability of processing and graphics capabilities.

Figure 3:
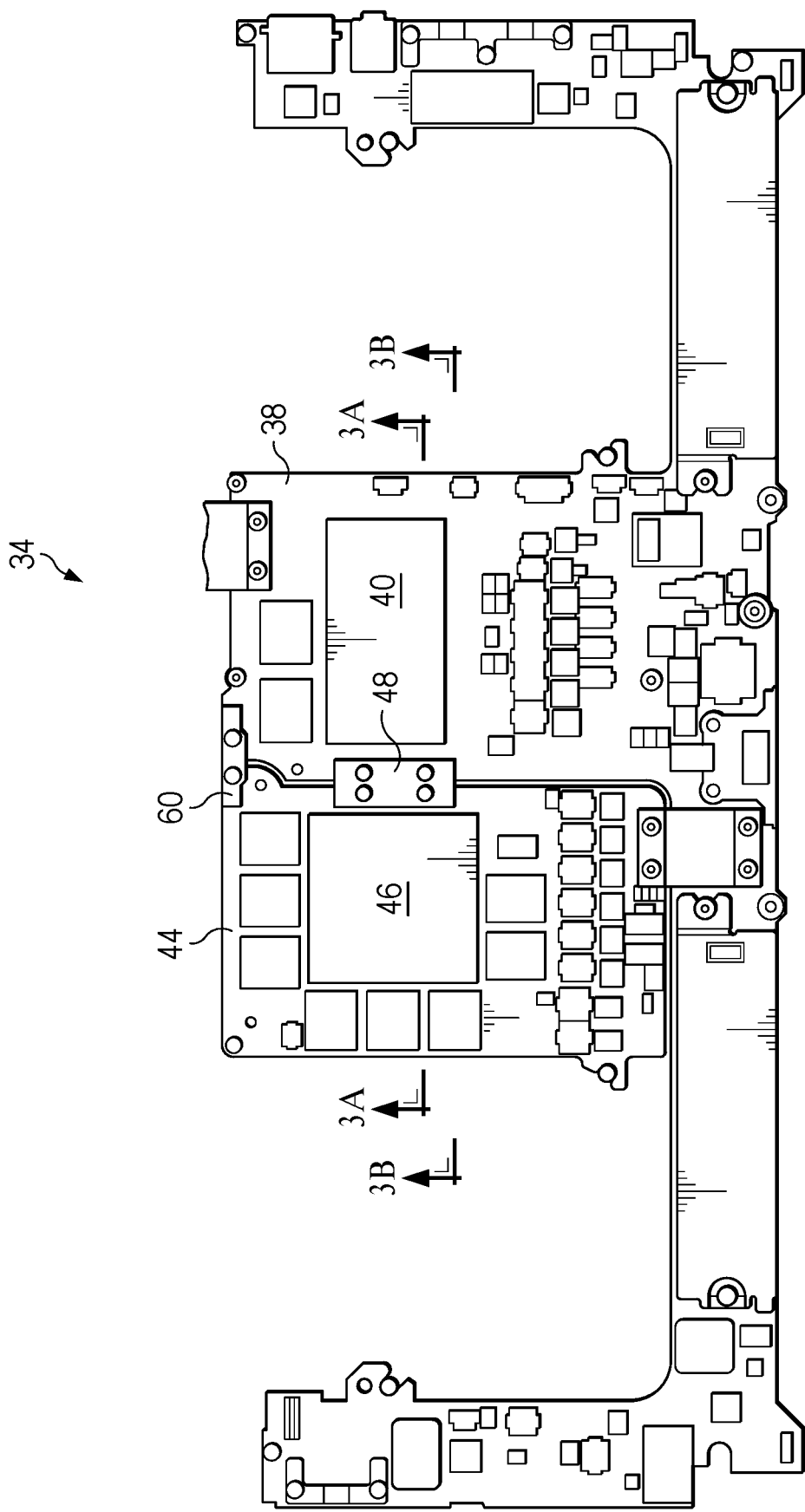
FIGS. 3, 3A and 3B depict a top view of a motherboard as an example embodiment of a main printed circuit board and a graphics printed circuit board interfaced by an interposer.
Figure 3A:
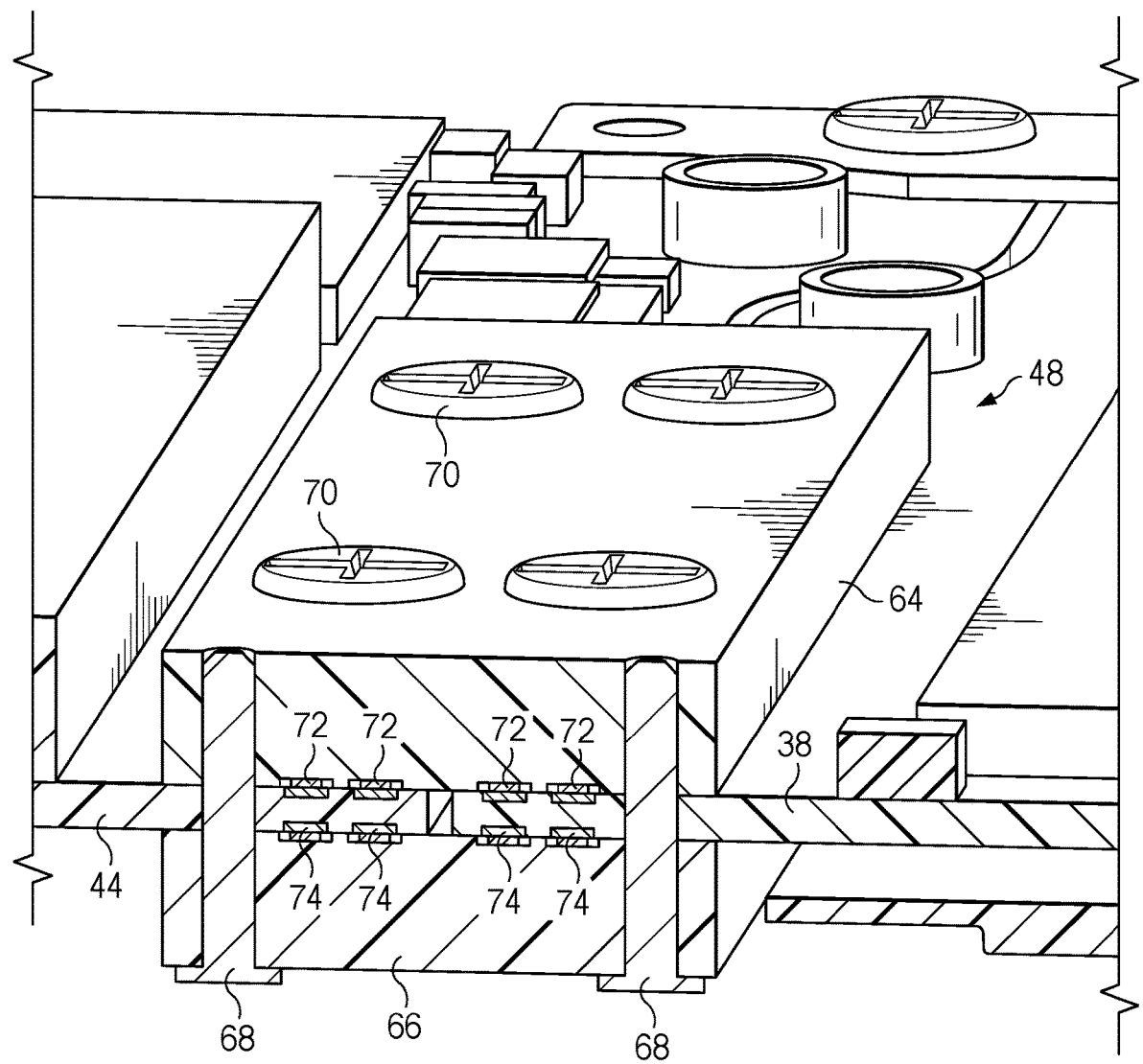
Figure 3B:
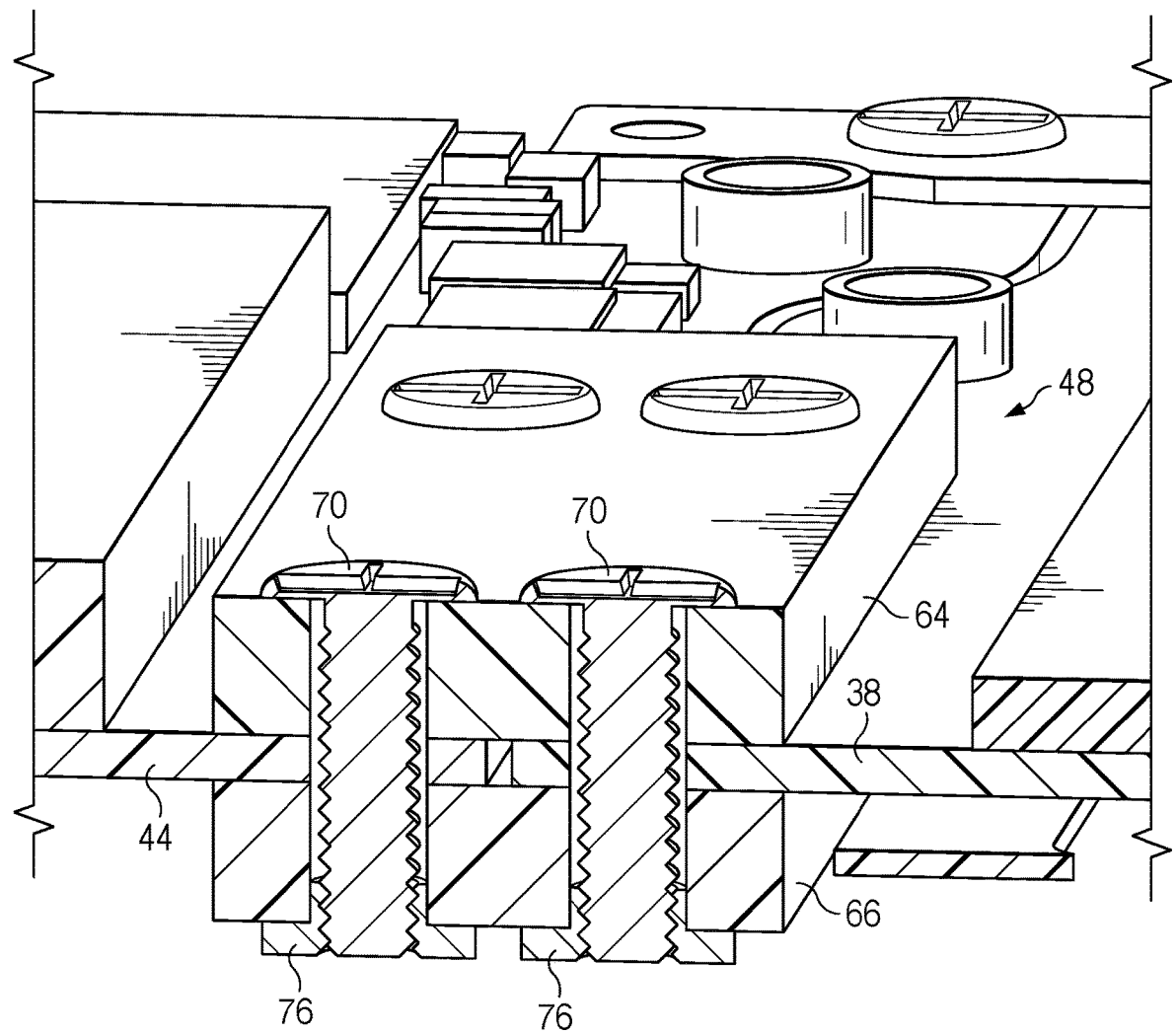

Referring now to FIGS. 3, 3A and 3B, a top view of a motherboard 34 depicts an example embodiment of a main printed circuit board 38 and a graphics printed circuit board 44 interfaced by an interposer 48. Main printed circuit board 38 is a conventional printed circuit board material substrate, such as fiberglass or similar dielectric material, that mounts CPU 40 to printed contact pads with a pick and place operation. Main printed circuit board 38 can operate as an information handling system without graphics printed circuit board by using graphics capability included in CPU 40 and defines the areas in which one or more cooling fans couple. Graphics printed circuit board 44 has GPU 46 coupled at an upper surface, such as with a pick and place operation, and supports graphics capabilities that are conventionally included on a motherboard. Each of main printed circuit board 38 and graphics printed circuit board 44 includes contact pads disposed at upper and lower surfaces along a side aligned with each other and contacts of interposer 48. Interposer 48 couples one portion at the upper surface of the main and graphics boards and another portion at the lower surface and establishes electrical signal communication between the main and graphics boards through wirelines defined in the interposer between the contacts of the interposer. The upper and lower interposer portions provide a robust structure to hold the main and graphics boards in a fixed relationship to each other. One or more metal braces 60 couple the main and graphics boards to each other to provide additional structure and support.

FIGS. 3A and 3B depict cross sectional side perspective views of interposer 48 coupling main printed circuit board 38 and graphics printed circuit board 44 to provide structural support and signal communication. FIG. 3A depicts a cross section having a lower portion 66 of interposer 48 with alignment pins 68 that fit into alignment openings of an upper portion 64 of interposer 48. The alignment pins and openings ensure that contact pads 74 on the upper and lower surfaces of main printed circuit board 38 and graphics printed circuit board 44 align with contacts 72 on interposer 48. For instance, contacts 72 on interposer 48 are spring fingers attached by pick and place on solder contact pads of interposer 48 and interconnected with other spring fingers by wirelines included in the interposer printed circuit board substrate. Screws 70 couple upper portion 64 with lower portion 66 to compress the contacts of interposer 48 against the contact pads of the main printed circuit board and graphics printed circuit board. FIG. 3B depicts a cross sectional view of interposer 48 having screws 70 coupled to threaded inserts 76 to provide a secure coupling and compression of spring contacts of the interposer against contact pads of the main and graphics printed circuit boards. In one example embodiment, threaded inserts 76 may have a ground and/or power interface with interposer 48 to provide increased conductive surfaces to communication ground and/or power between the main and graphics printed circuit boards.

Figure 4:
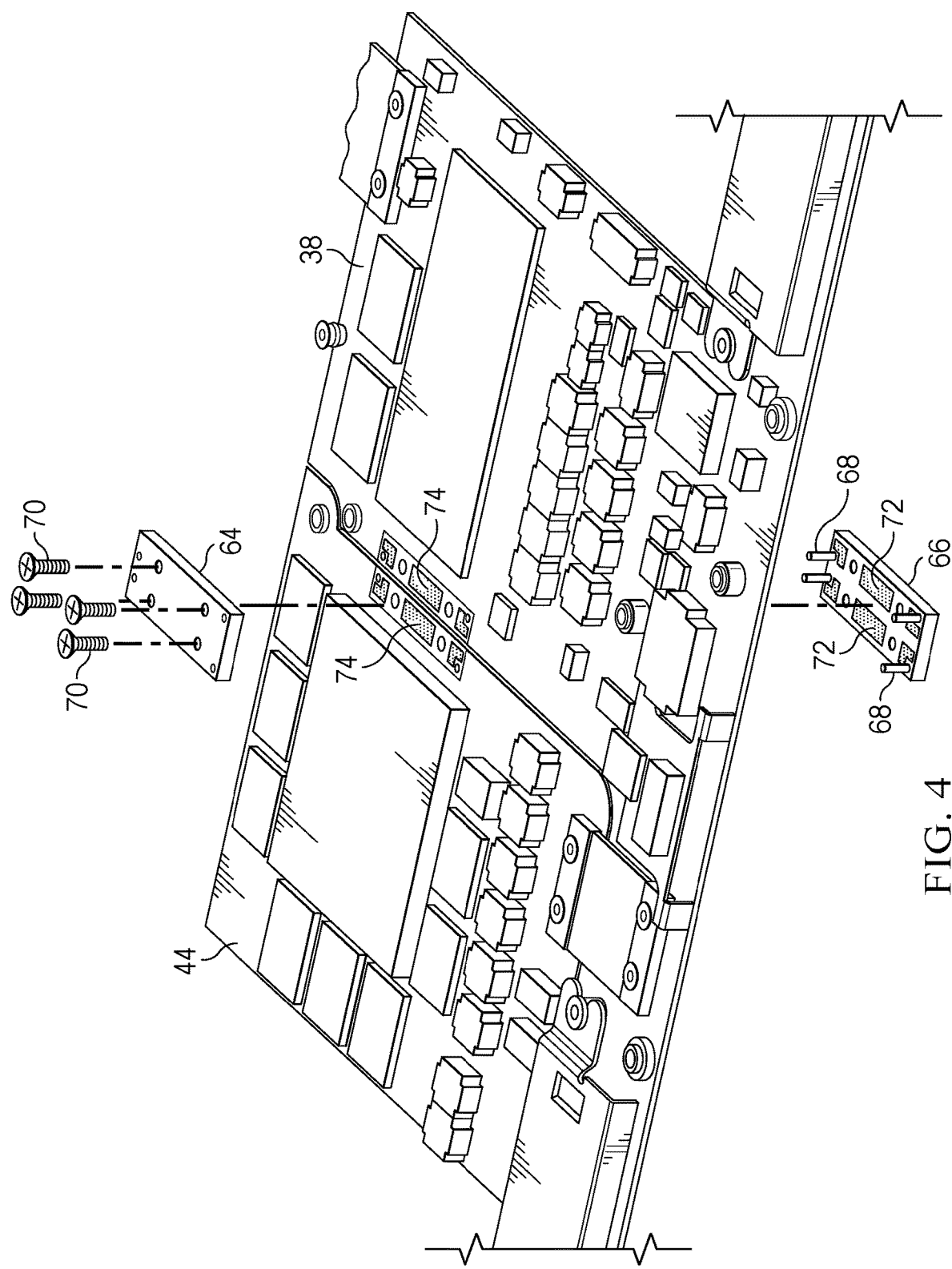
FIG. 4 depicts an exploded upper perspective view of the interposer aligned to couple the main printed circuit board and graphics printed circuit board to define the motherboard.

Referring now to FIG. 4, an exploded upper perspective view depicts the interposer aligned to couple the main printed circuit board 38 and graphics printed circuit board 44 to define motherboard. Screws 70 insert through upper portion 64, through openings of the main and graphics printed circuit boards and through lower portion 66 to engaged the inserts and compress the interposer against the upper and lower surfaces of the main and graphics printed circuit boards. Signal contact pads 74 at the upper and lower surfaces of the main and graphics printed circuit boards contact against spring biased contacts 72 at the inner surfaces of upper portion 64 and lower portion 66 to communicate signals, power and ground between main printed circuit board 38 and graphics printed circuit board 44. For instance, upper portion 64 and lower portion 66 of the interposer are a conventional fiberglass printed circuit board substrate with wirelines integrated that communicate between contacts 72 so that the contacts 72 communicate between contact pads 74 of main printed circuit board 38 and graphics printed circuit board 44. Although the example embodiment has spring biased contacts on the interposed that communicate with contact pads of the main and graphics printed circuit boards, in alternative embodiments, some or all of the spring contacts may couple by pick and place to the main and graphics printed circuit boards to align with contact pads of the interposer upper and lower portions.

Figure 5:
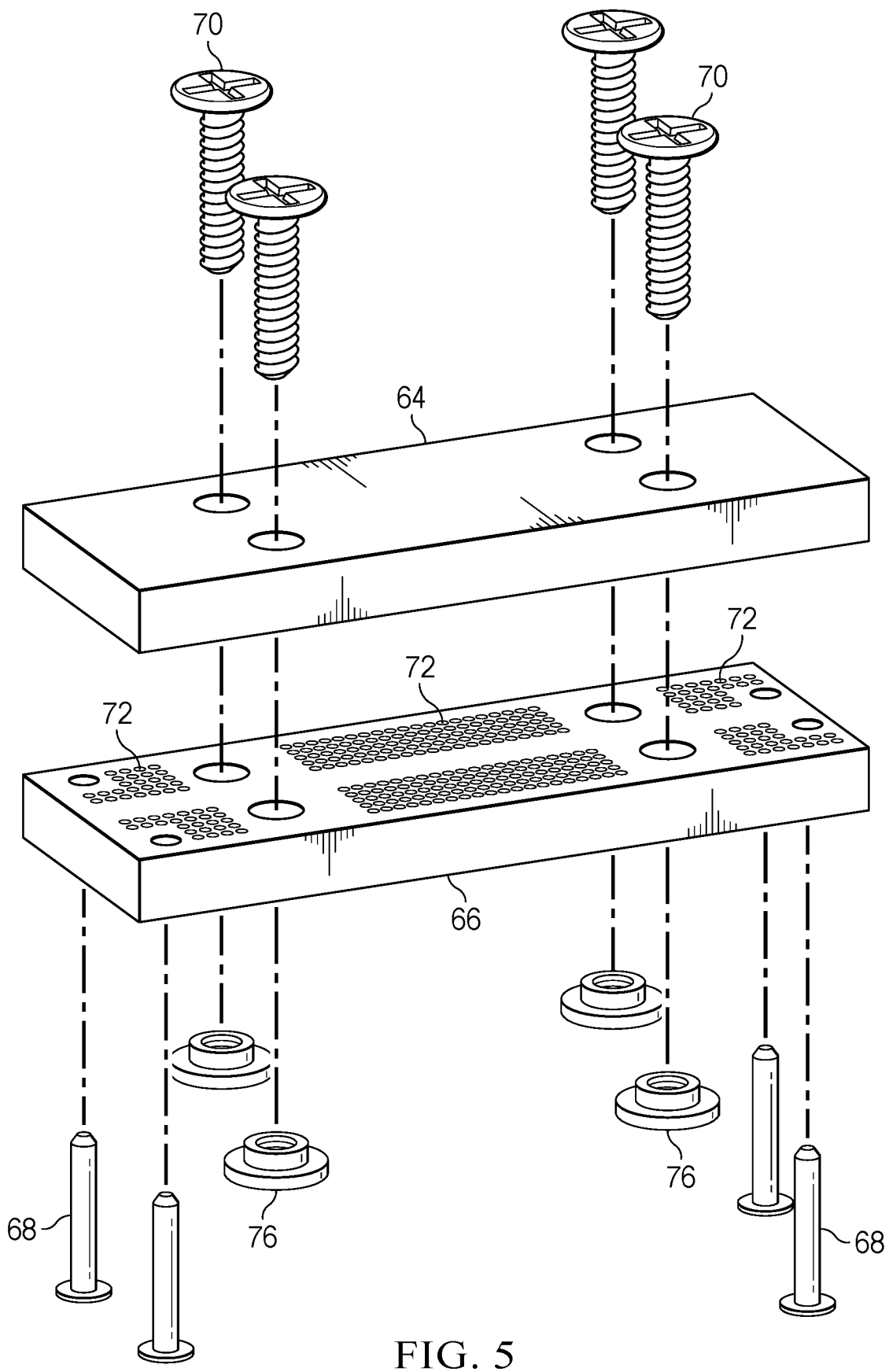
FIG. 5 depicts an exploded perspective view of the interposer before assembly to the main and graphics printed circuit boards.

Referring now to FIG. 5, an exploded perspective view depicts the interposer before assembly to the main and graphics printed circuit boards. Upper portion 64 and lower portion 66 are equal sized rectangle shaped printed circuits of conventional substrate, such as fiberglass with an array of electrical contact pads that have spring biased contacts 72 soldered in place with a pick and place or similar operation. Alignment pins 68 press fit into place to ensure alignment of contacts 72 against contact pads of the main and graphics printed circuit boards. Screws 70 insert through openings to engage with press fit screw inserts 76 to compress the interposer upper portion and lower portion together and securely hold the main and graphics printed circuit boards in electrical contact with each other interfaced through integrated wirelines of the interposer.

Figure 6A:
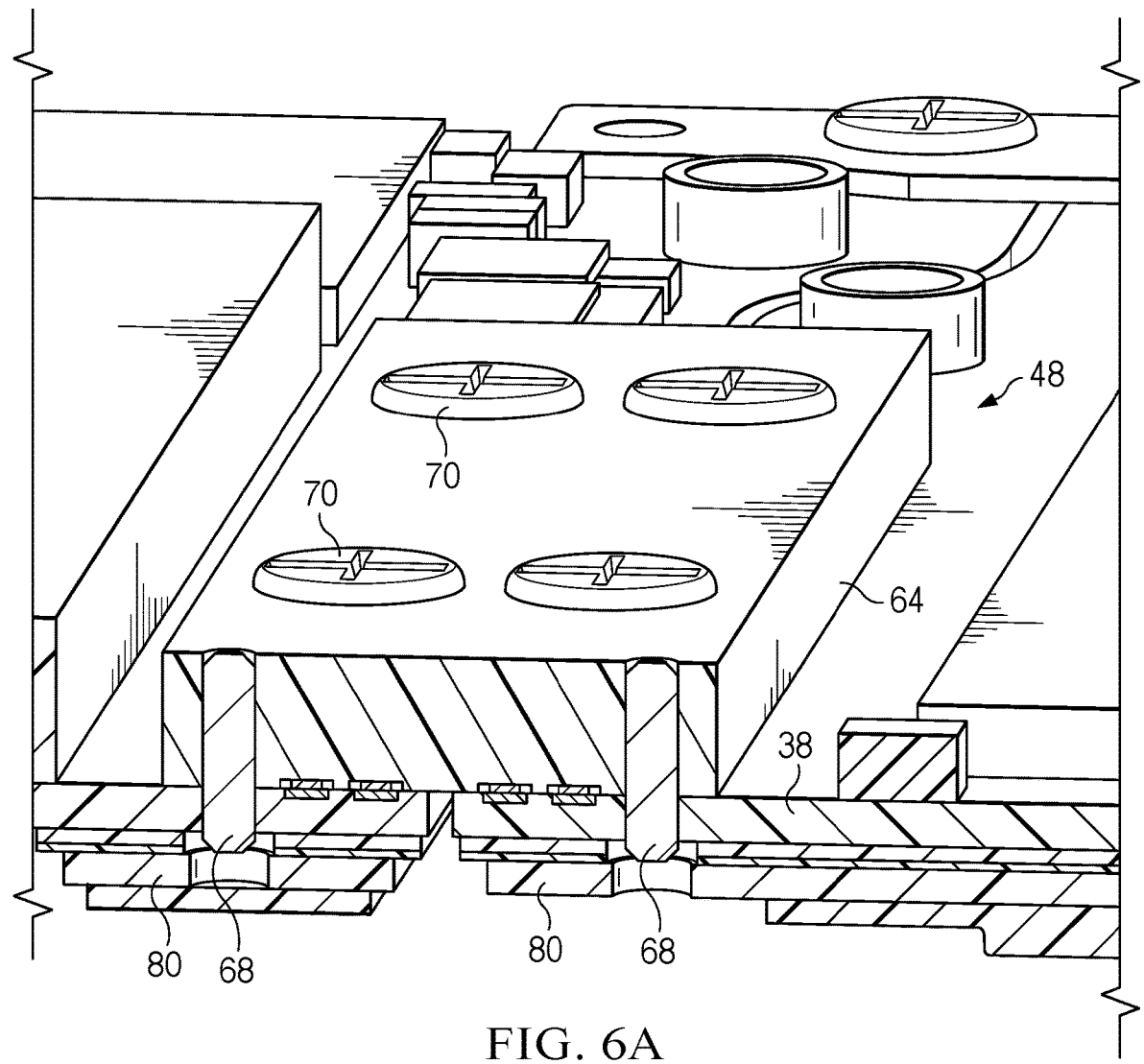
FIGS. 6A, 6B and 6C depict an alternative interposer embodiment having interposer contacts that interface with contact pads at only an upper surface of the main and graphics printed circuit boards.
Figure 6B:
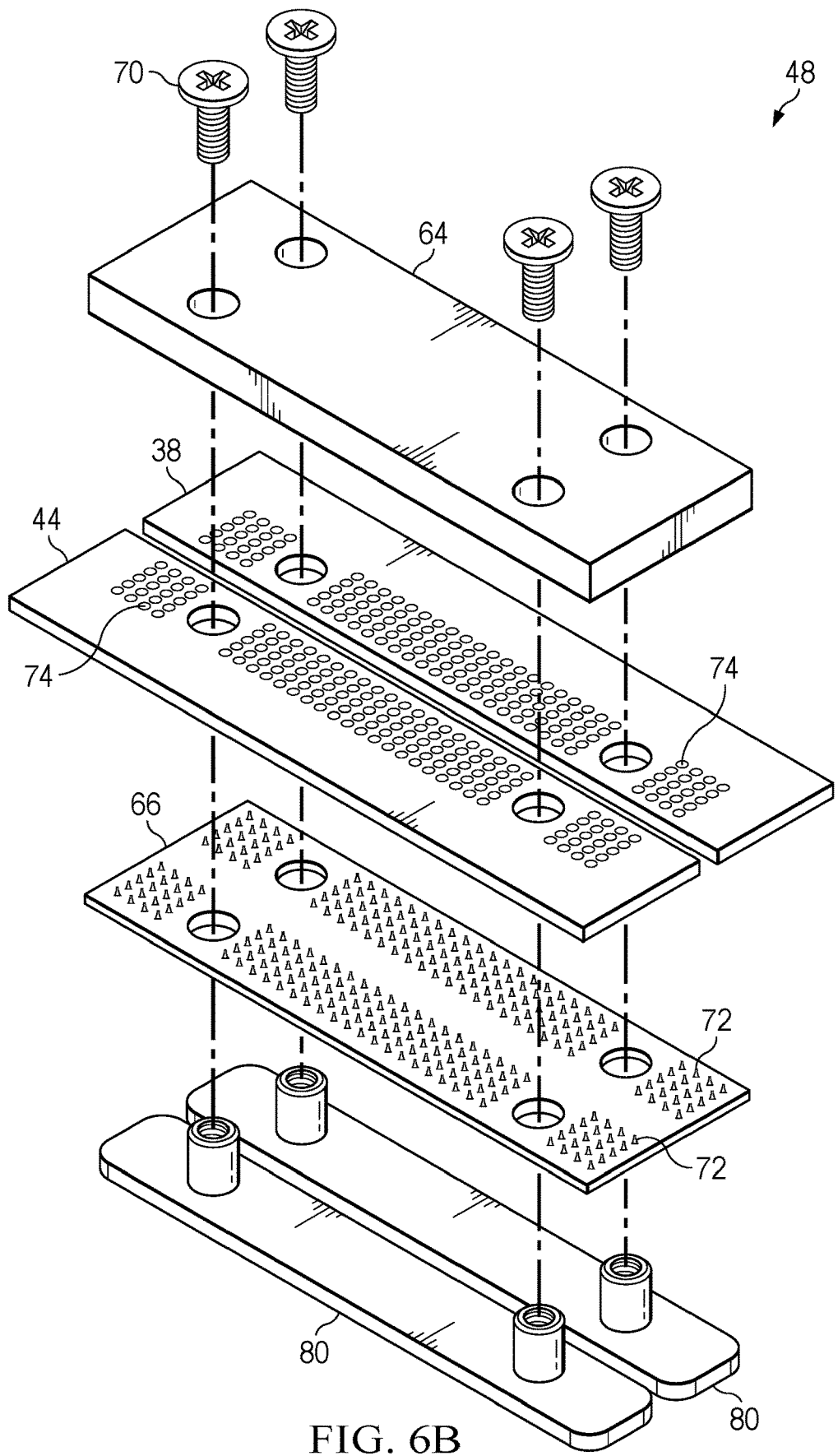
Figure 6C:
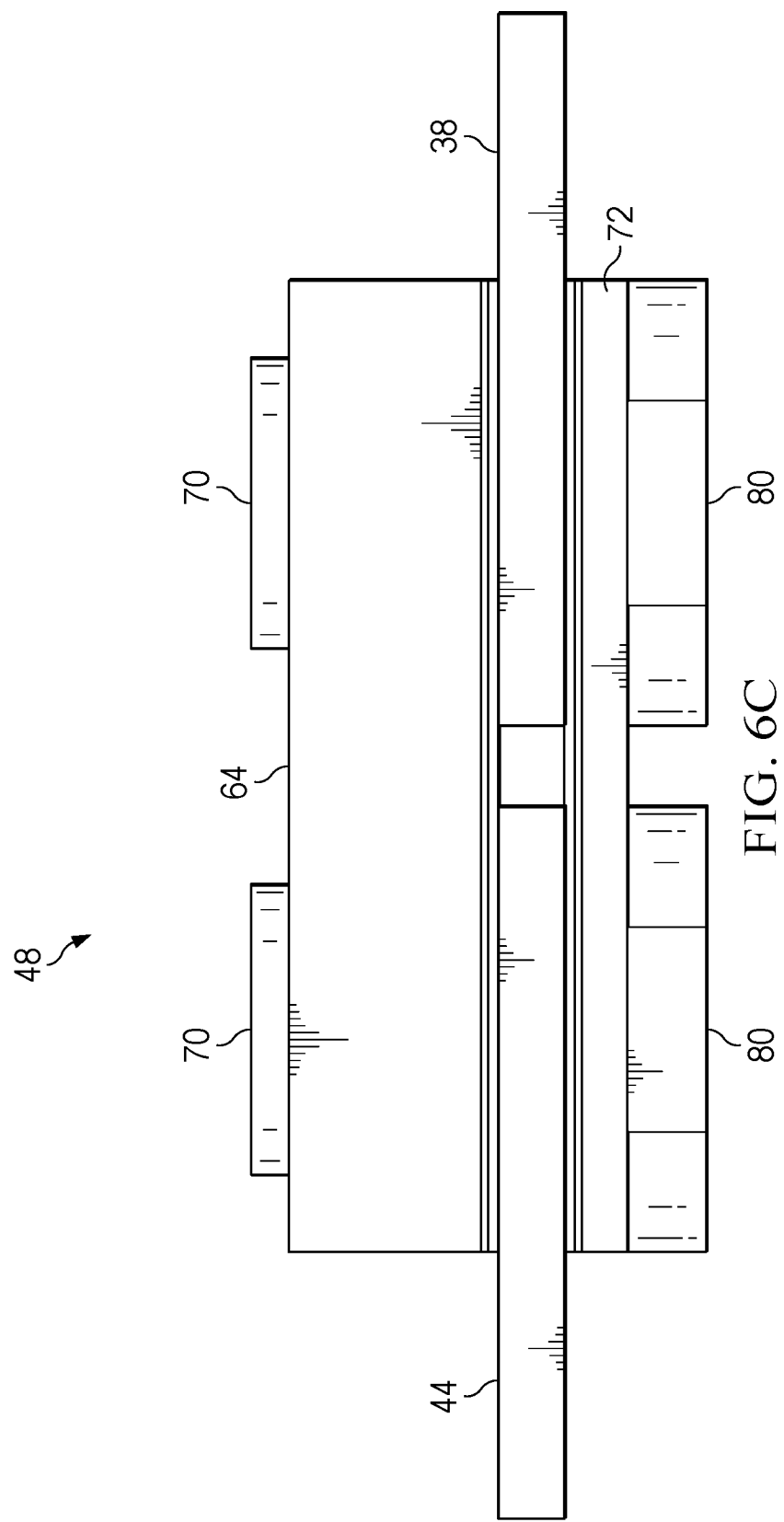

Referring now to FIGS. 6A, 6B and 6C, an alternative interposer 48 embodiment depicts interposer contacts that interface with contact pads at only an upper surface of the main and graphics printed circuit boards. Interposer 48 has only an upper portion that is a printed circuit board with wireline interfaces while a lower set of sheet metal portions 80 provide structure support to hold main printed circuit board 38 to graphics printed circuit board 44. Alignment pins 68 ensure alignment of the contacts and contact pads and screws 70 couple through interposer 48 and sheet metal portions 80 to hold the motherboard assembly together. In the example embodiment, the interposer 48 printed circuit board substrate has an increased thickness to provide additional support and avoid warpage that could cause contacts and contact pads to have inconsistent compression. FIG. 6B illustrates an alternative embodiment of the interposer 48 having the upper portion 64 with the increased thickness as shown in FIG. 6A but also including a lower portion 66 having a reduced thickness and supported by steel sheet metal portions 80 below the lower side. An advantage of this arrangement is that the same upper portion may be used with or without a lower portion depending upon the number of signal, ground and power interfaces needed for the main and graphic printed circuit boards. For example, each interposer face has 140 positions so that including upper and lower contacts doubles the single interposer face of contacts to a total of 280 positions. In the example embodiment, sheet metal portions 80 integrate the insert portion which also acts as an alignment tool to align the contacts and contact pads. FIG. 6C depicts a side view of the interposer 48 coupling main printed circuit board 38 and graphics printed circuit board 44 with screws 70 coupling to threads of the integrated inserts of sheet metal portions 80. In the example embodiment, the upper portion 64 has a thickness of 2.5 mm and the lower portion has a thickness of 0.7 mm with the sheet metal portions having 1.0 mm of thickness.

Figure 7:
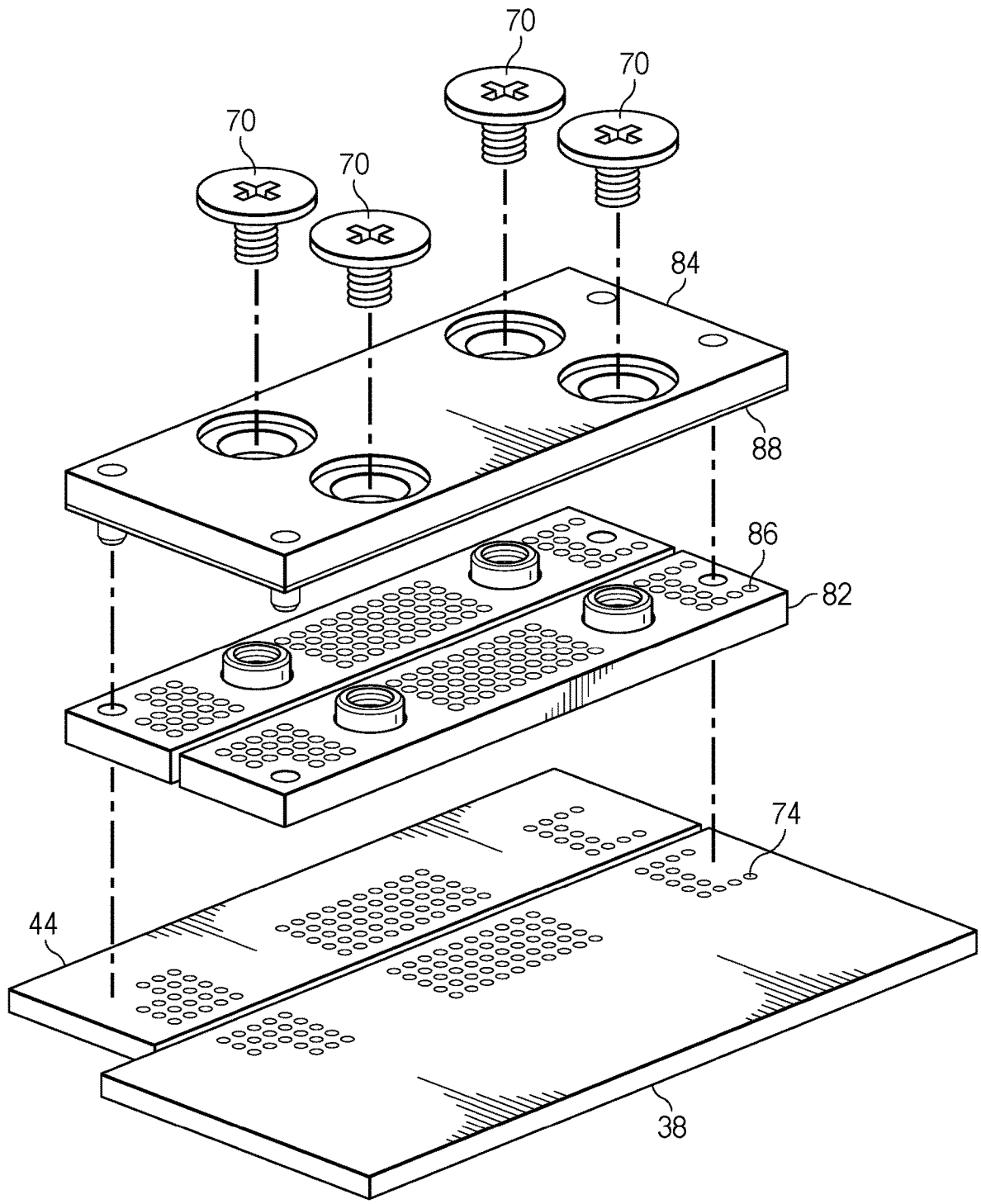
FIG. 7 depicts another alternative embodiment of an interposer that arranges transfer of signals between a main printed circuit board and graphics printed circuit board through a bridge portion and two upper portions.

Referring now to FIG. 7, another alternative embodiment depicts an interposer that arranges transfer of signals between a main printed circuit board 38 and graphics printed circuit board 44 through a bridge portion 84 and two upper portions 82. In the example embodiment, contact pads 74 on the main and graphics printed circuit boards interface with contacts 86 on the upper and lower sides of each of the two upper portions 82 to transfer signals vertically so that bridge portion 84 can transfer the signals laterally. The interface between the upper portions and the main and graphics printed circuit boards can have a variety of forms to support different types of configurations and manufacturer techniques. In the example embodiment, spring contacts 88 at the bottom surface of bridge portion 84 contact against contact pads 86 of the upper portions. Screw inserts 90 couple into each of upper portions 82 to accept screws 70 that assembled the interposer 48. In one example embodiment, the upper portions and bridge portion are assembled as a complete piece and then soldered onto the main and graphics printed circuit boards, such as with a pick and place process. An advantage of this approach is that the wirelines of the bridge portion determine routing of signals between the main and graphics printed circuit boards and can adapt as needed when the CPU and GPU change while the remainder of the assembly is unchanged and configured for automated assembly.

Figure 8:
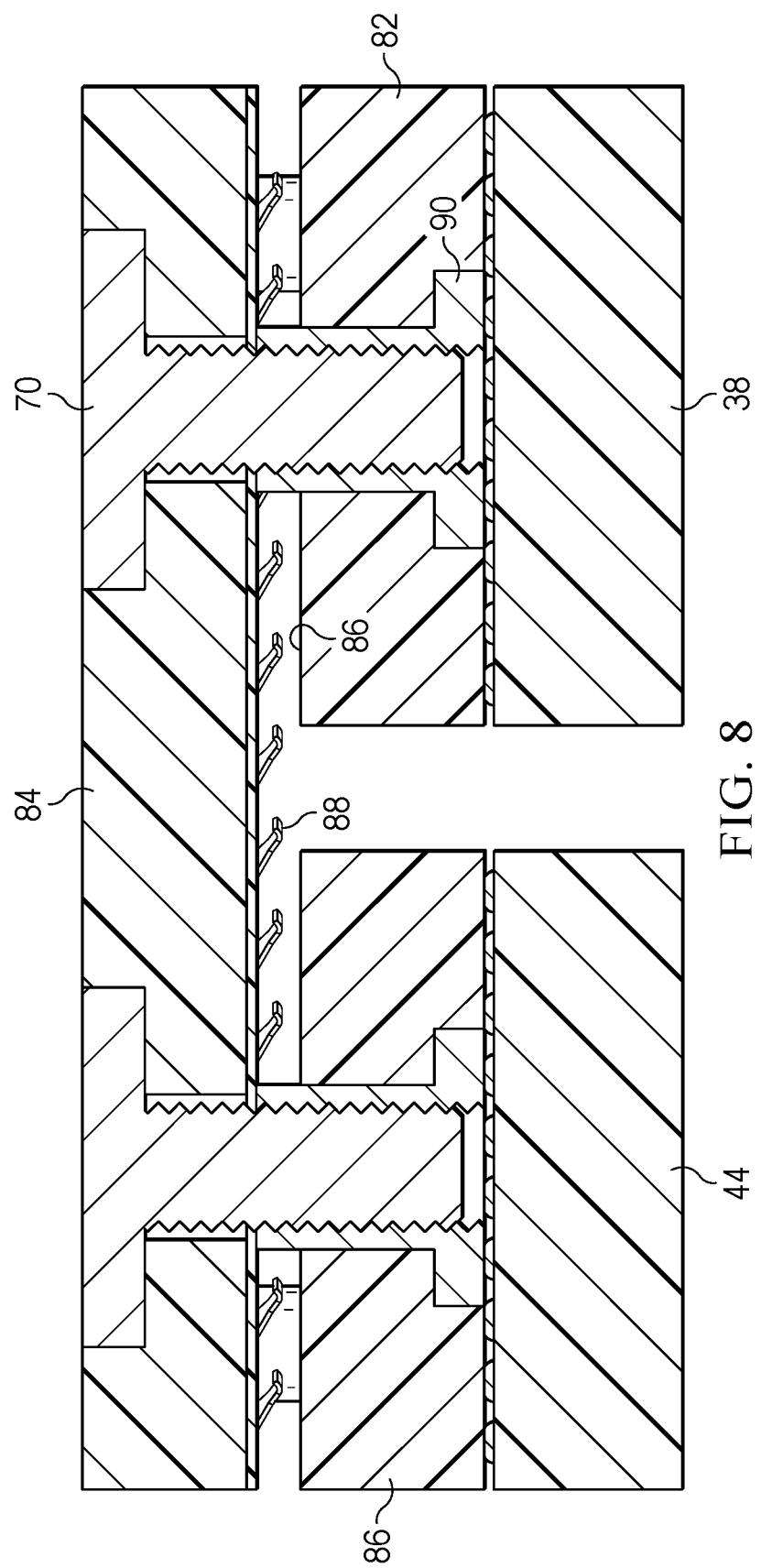
FIG. 8 depicts a side sectional view of an interposer having a bridge portion coupled by screws to screw inserts fit in upper portions.

Referring now to FIG. 8, a side sectional view depicts an interposer 48 having a bridge portion 84 coupled by screws 70 to screw inserts 90 fit in upper portions 82. Spring contacts 88 compress down against contact pads 86 of upper portions 82 to transfer signals between main printed circuit board 38 and graphics printed circuit board 44. In the example embodiment, upper portions 82 at their bottom side couple with solder to main printed circuit board 38 and graphics printed circuit board 44. In an alternative embodiment, other types of interfaces may be used, such as a ball and socket arrangement. In the example embodiment, screw insert 90 is an M1.6 nut protrusion that minimizes the height of the bridge portion over the main and graphics printed circuit boards.

Figure 9:
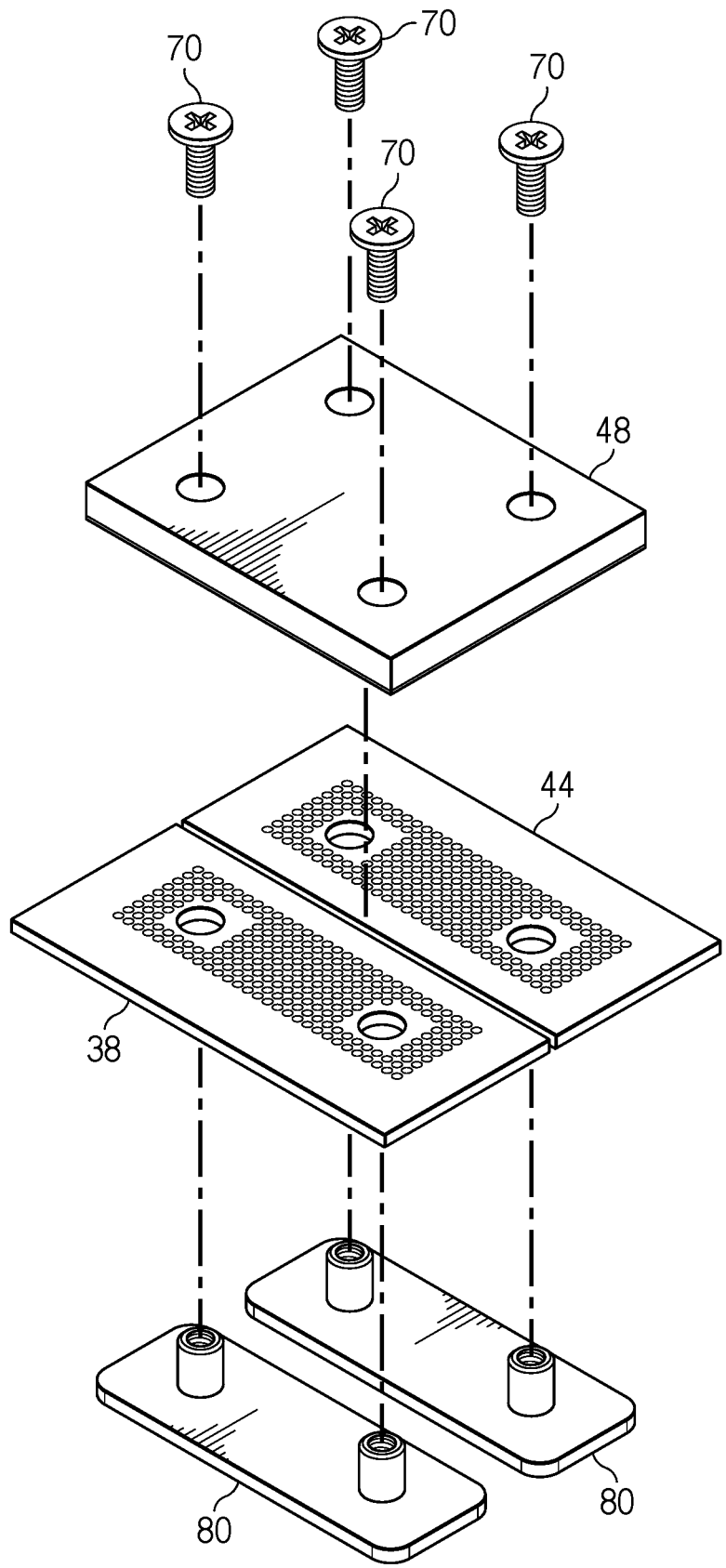
FIG. 9 depicts another alternative embodiment of an interposer having first and second sheet metal portions each including screw inserts that fit into openings of main printed circuit board and graphics printed circuit board.

Referring now to FIG. 9, another alternative embodiment of interposer 48 is depicted. In the example embodiment, first and second sheet metal portions 80 each include screw inserts that fit into openings of main printed circuit board 38 and graphics printed circuit board 44. Contact pads on the upper surface of the main and graphics printed circuit boards align via the screw inserts and openings with spring contacts on the bottom surface of interposer 48 so that screws 70 compress the spring contacts against the contact pads to transfer signals through wirelines of interposer 48 between the main and graphics printed circuit boards. In alternative embodiments, the spring contacts may be placed on the main and graphics printed circuit boards to compress against contacts of the interposer.

Figure 10:
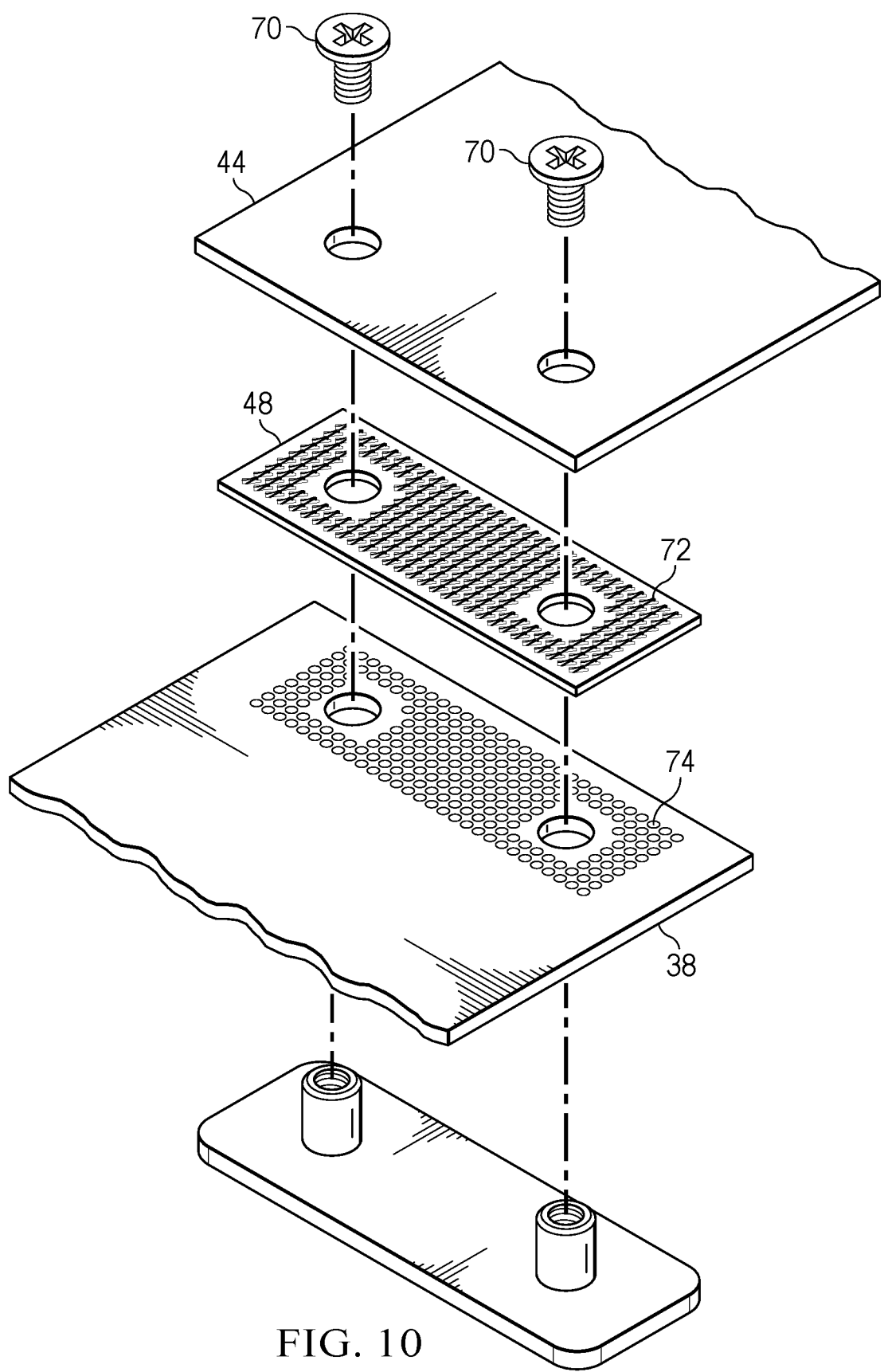
FIG. 10 depicts another alternative embodiment of interposer 48 having a graphics printed circuit board that aligns over top of a main printed circuit board to have openings formed in each fit onto screw inserts of an underlying sheet metal portion.

Referring now to FIG. 10 another alternative embodiment of interposer 48 is depicted. In the example embodiment, graphics printed circuit board 44 aligns over top of main printed circuit board 38 to have openings formed in each fit onto screw inserts of an underlying sheet metal portion 80. Interposer 48 has spring contacts 72 coupled at upper and lower surfaces to directly transfer signals between each contact of the main printed circuit board and graphics printed circuit board. In the example embodiment, signals are transferred directly through vias formed vertically in interposer 48, although alternative embodiments may transfer signals through wirelines in a lateral plane before transfer. Sheet metal portion 80 reinforces the assembly when screws 70 couple into the inserts and compress the interposer between the printed circuit boards.

Figure 11A:
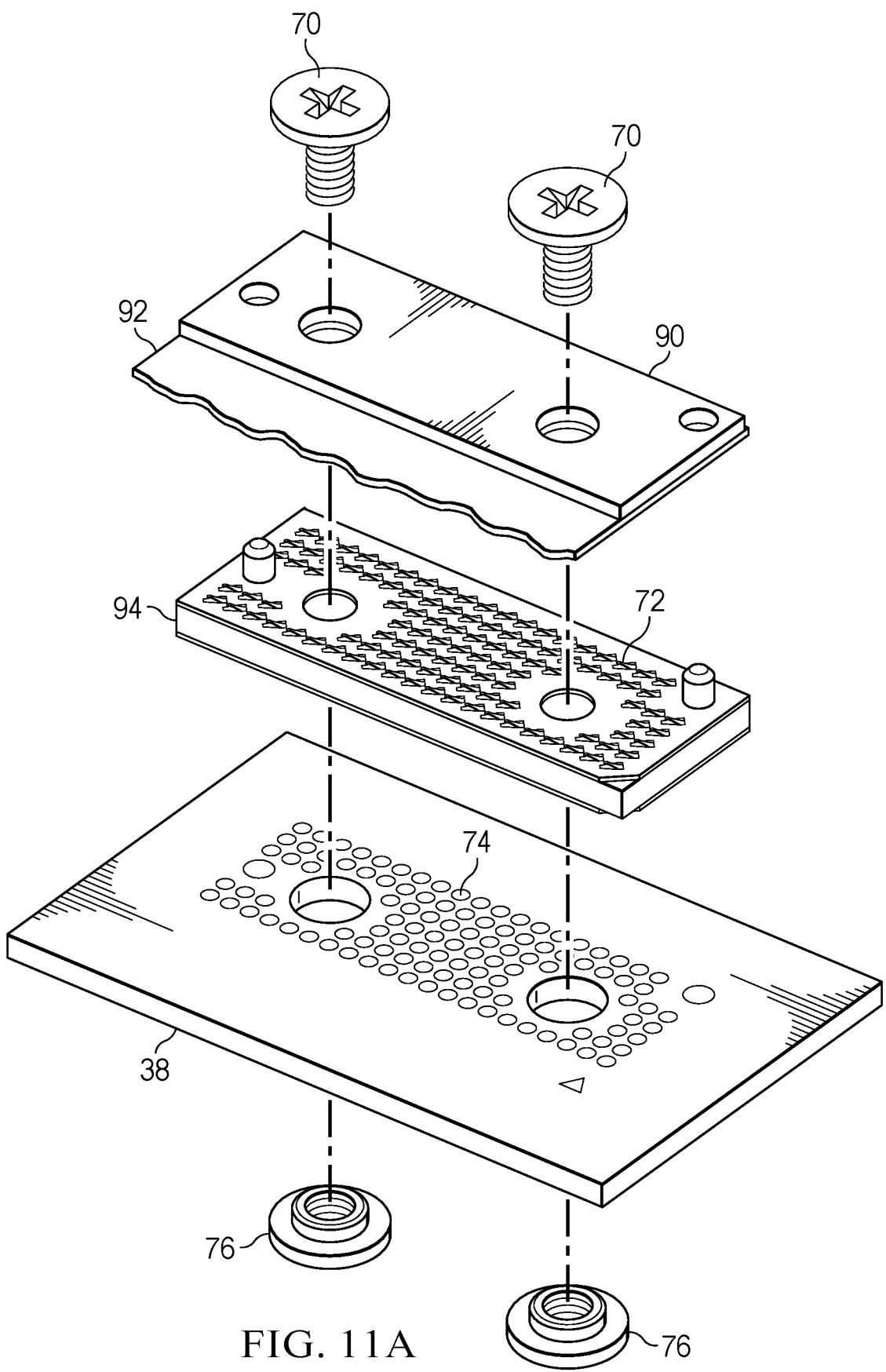
FIGS. 11A and 11B depict another alternative embodiment of an interposer.
Figure 11B:
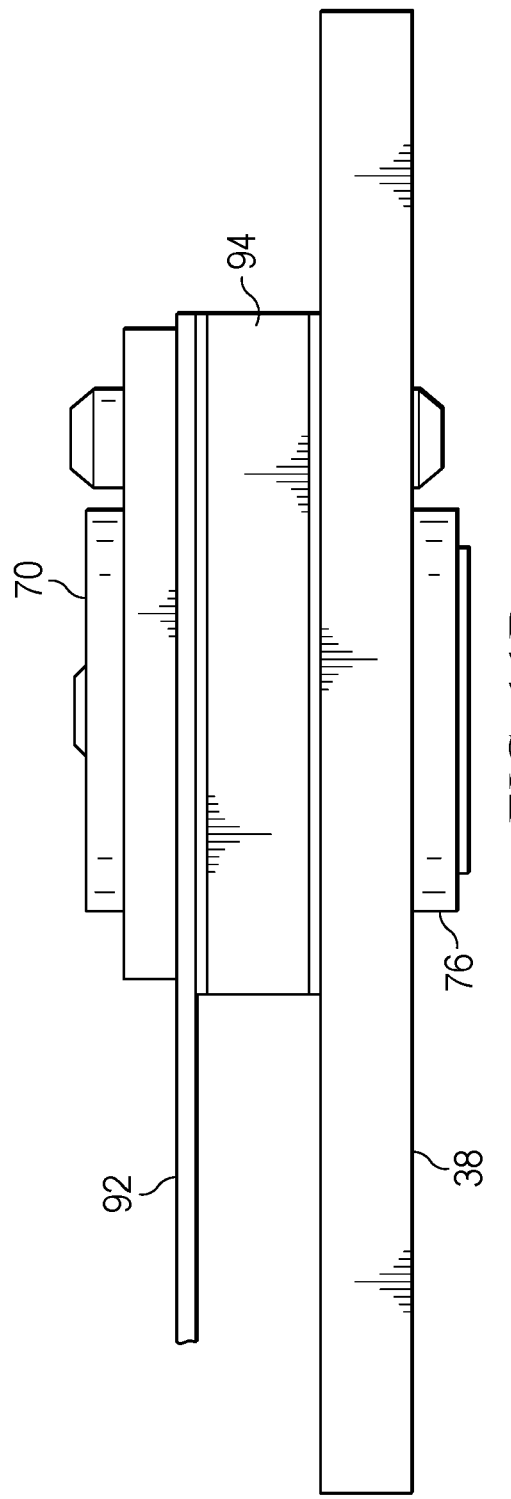

Referring now to FIGS. 11A and 11B, another alternative embodiment of an interposer 48 is depicted. In the example embodiment, a flexible printed circuit board 92 interfaces main printed circuit board 38 with a graphics printed circuit board. FIG. 11A depicts an exploded view having contact pads 74 of main printed circuit board 38 aligned with spring contacts 72 of an intermediate board 94 to transfer signals with the main printed circuit board. Similarly, contact pads on the bottom surface of flexible printed circuit board 92 communicate with spring contacts 72 at the upper surface of intermediate board 94. Screw inserts 76 accept screws 70 that work against a sheet metal portion 80 to compress flexible printed circuit board against intermediate board 94, and to compress intermediate board 94 against main printed circuit board 38. Although the graphics printed circuit board is not depicted, a similar interposer may be used to couple flexible printed circuit board 92 to the graphics printed circuit board.

Although the present invention has been described in detail, it should be understood that various changes, substitutions and alterations can be made hereto without departing from the spirit and scope of the invention as defined by the appended claims.

What is claimed is:

1. An information handling system comprising:
   a housing;
   a main printed circuit board coupled to the housing;

a central processing unit coupled to the main printed circuit board and operable to execute instructions that process information, the main printed circuit board having plural contact pads exposed at an upper and lower surface;

a graphics printed circuit board coupled to the housing;

a graphics processing unit coupled to the graphics printed circuit board and operable to process the information to define visual images for presentation at a display, the graphics printed circuit board having plural contact pads exposed at an upper and lower surface; and an interposer having an upper portion and a lower portion, the upper portion having contacts that interface with the upper surface contact pads of both the graphics printed circuit board and the main printed circuit board, the lower portion having contacts that interface with the lower surface contact pads of both the graphics printed circuit board and the main printed circuit board, the interposer communication information between the central processing unit and the graphics processing unit.

2. The information handling system of claim 1 further comprising:

an alignment pin extending up from the lower portion; and wherein the alignment pin passes through an opening of the main printed circuit board, the graphics printed circuit board and the upper portion positioned so that insertion of the alignment pin aligns the contact pads and the contacts.

3. The information handling system of claim 2 wherein the contacts comprise spring contacts biased away from the upper portion and the lower portion.

4. The information handling system of claim 1 wherein at least one of the upper portion of the lower portion solder to at least one of the main printed circuit board or the graphics printed circuit board.

5. The information handling system of claim 1 further comprising:

a screw insert fit into an opening of the interposer lower portion; and a screw inserted through an opening of the interposer upper portion, the main printed circuit board and the graphics printed circuit board to engage the screw insert and compress contacts against the contact pads.

6. The information handling system of claim 5 wherein the interposer upper portion, the interposer lower portion, the main printed circuit board and the graphics printed circuit board each have a fiberglass substrate.

7. The information handling system of claim 5 wherein the screw insert extends from the interposer lower portion, through the graphics printed circuit board and the main printed circuit board to align the contacts and contact pads.

8. The information handling system of claim 7 further comprising:

a sheet metal support coupled to the screw insert and disposed under the interposer lower portion to press upward against the interposer lower portion.

9. The information handling system of claim 8 wherein the interposer lower portion is less than half as thick as the interposer upper portion.

10. A method for processing information comprising:

coupling a central processing unit to a main printed circuit board having contact pads at a top and bottom surface;

coupling a graphics processing unit to a graphics printed circuit board having contact pads at a top and bottom surface; and coupling the main printed circuit board to the graphics printed circuit board with an interposer having contacts that align with the contact pads on the top surface and the bottom surface of the main printed circuit board and the graphics printed circuit board, the interposer communicating signals between the main printed circuit board and the graphics printed circuit board through the contacts and contact pads.

11. The method of claim 10 further comprising:

placing an upper portion of the interposer on the top surface of the main printed circuit board and the graphics printed circuit board;

placing a lower portion of the interposer on the bottom surface of the main printed circuit board and the graphics printed circuit board; and compressing the upper portion and lower portion together to bring the contacts against the contact pads.

12. The method of claim 11 further comprising:

coupling a screw insert in an opening of the lower portion; and engaging a screw in the screw insert through an opening of the upper portion.

13. The method of claim 12 further comprising:

inserting the screw insert through the opening in the lower portion, an opening in the main printed circuit board and the opening in the upper portion; and aligning the contacts and contact pads with the screw insert.

14. The method of claim 13 further comprising:

coupling the screw insert to sheet metal; and disposing the sheet metal below the lower portion to support the lower portion.

15. The method of claim 14 further comprising forming the upper portion, the lower portion, the main printed circuit board portion and the graphics printed circuit board portion have a fiberglass substrate.

16. The method of claim 15 wherein the upper portion is at least twice the thickness of the lower portion.

17. An information handling system motherboard comprising:

a main printed circuit board having a central processing unit operable to execute instructions that process information, the main printed circuit board having plural contact pads exposed at an upper and lower surface;

a graphics printed circuit board having a graphics processing unit operable to process the information to define visual images for presentation at a display, the graphics printed circuit board having plural contact pads exposed at an upper and lower surface; and an interposer having an upper portion and a lower portion, the upper portion having contacts that interface with the upper surface contact pads of both the graphics printed circuit board and the main printed circuit board, the lower portion having contacts that interface with the lower surface contact pads of both the graphics printed circuit board and the main printed circuit board, the interposer communication information between the central processing unit and the graphics processing unit.

18. The information handling system motherboard of claim 17 further comprising:

a screw insert fit into an opening of the interposer lower portion; and a screw inserted through an opening of the interposer upper portion, the main printed circuit board and the graphics printed circuit board to engage the screw insert and compress contacts against the contact pads.

19. The information handling system motherboard of claim 18 wherein the screw insert extends from the interposer lower portion, through the graphics printed circuit board and the main printed circuit board to alight the contacts and contact pads.

20. The information handling system motherboard of claim 19 further comprising:
- a sheet metal support coupled to the screw insert and disposed under the interposer lower portion to press upward against the interposer lower portion;
- wherein the interposer upper portion is at least twice as thick as the interposer lower portion.

* * * * *

UNITED STATES PATENT AND TRADEMARK OFFICE
CERTIFICATE OF CORRECTION

| | | |
|---|---|---|
| PATENT NO. | : 12,439,518 B2 | Page 1 of 1 |
| APPLICATION NO. | : 18/542992 | |
| DATED | : October 7, 2025 | |
| INVENTOR(S) | : Allen B. McKittrick et al. | |

It is certified that error appears in the above-identified patent and that said Letters Patent is hereby corrected as shown below:

In the Claims

In Column 9, Claim 1, Line 19, please replace "communication" with --communicates--;
In Column 10, Claim 17, Line 57, please replace "communication" with --communicates--;
In Column 11, Claim 19, Line 4, please replace "alight" with --align--.

Signed and Sealed this
Ninth Day of December, 2025

John A. Squires
*Director of the United States Patent and Trademark Office*